(12) United States Patent
Kuramoto

(10) Patent No.: US 9,935,423 B2
(45) Date of Patent: Apr. 3, 2018

(54) SEMICONDUCTOR LASER DEVICE

(71) Applicant: Mitsubishi Electric Corporation, Tokyo (JP)

(72) Inventor: Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/344,830

(22) Filed: Nov. 7, 2016

(65) Prior Publication Data

US 2017/0264075 A1 Sep. 14, 2017

(30) Foreign Application Priority Data

Mar. 9, 2016 (JP) ................................. 2016-045757

(51) Int. Cl.
| | |
|---|---|
| *H01S 5/022* | (2006.01) |
| *H01S 5/042* | (2006.01) |
| *H01S 5/10* | (2006.01) |
| *H01S 5/22* | (2006.01) |

(52) U.S. Cl.
CPC ........ *H01S 5/02276* (2013.01); *H01S 5/0425* (2013.01); *H01S 5/1042* (2013.01); *H01S 5/22* (2013.01); *H01S 2301/02* (2013.01)

(58) Field of Classification Search
CPC ...... H01S 5/22–5/2277; H01S 5/02276; H01S 5/0425; H01S 5/0424; H01S 5/4031; H01S 5/4081; H01S 5/4087
See application file for complete search history.

(56) References Cited

U.S. PATENT DOCUMENTS

| | | | |
|---|---|---|---|
| 7,132,691 B1 | 11/2006 | Tanabe et al. | |
| 9,300,112 B2 * | 3/2016 | Lee | ......... H01S 5/024 |
| 2006/0104565 A1 * | 5/2006 | Shimada | ......... H01S 5/4025 |
| | | | 385/14 |
| 2008/0317080 A1 * | 12/2008 | Kameyama | ......... H01S 5/0207 |
| | | | 372/44.01 |
| 2010/0189152 A1 * | 7/2010 | Harder | ......... H01S 5/02276 |
| | | | 372/46.01 |
| 2011/0134948 A1 * | 6/2011 | Kawakami | ......... B82Y 20/00 |
| | | | 372/34 |

FOREIGN PATENT DOCUMENTS

| | | |
|---|---|---|
| JP | 2011-049338 A | 3/2011 |
| TW | 449949 B | 8/2001 |

OTHER PUBLICATIONS

An Office Action issued by Taiwanese Patent Office dated Nov. 22, 2017, which corresponds to Taiwanese Patent Application No. 105136222 and is related to U.S. Appl. No. 15/344,830.

\* cited by examiner

*Primary Examiner* — Joshua King
(74) *Attorney, Agent, or Firm* — Studebaker & Brackett PC

(57) ABSTRACT

A semiconductor laser device includes: a semiconductor laser including a plurality of emission regions into which currents are injected to emit laser beams and first and second major surfaces opposite to each other; and a plurality of first wires bonded to the first major surface of the semiconductor laser, wherein the first major surface of the semiconductor laser has a first stripe region corresponding to one of the plurality of emission regions, and a second stripe region corresponding to another of the plurality of emission regions, and the number of the first wires bonded to the first stripe region is larger than the number of the first wires bonded to the second stripe region.

5 Claims, 5 Drawing Sheets

SEMICONDUCTOR LASER DEVICE

BACKGROUND OF THE INVENTION

Field

The present invention relates to a semiconductor laser device for use as a visible light source for a projector or the like or as an excitation light source for a processing machine or the like.

Background

A semiconductor laser has merits such as reduction in size, good color reproducibility, low power consumption and high luminance, and is expected as a light source for projectors or projection-type displays for cinemas or the like (see, for example, JP 2011-49338 A). However, when laser beam is applied to a surface to be illuminated, a speckled pattern called speckle noise appears, showing a flickering image. The cause of this phenomenon is interference due to single-wavelength high-coherence characteristics of the laser beam. Speckle noise causes a video viewer to have a feeling of annoyance and fatigues the viewer's eyes. It is desirable to reduce the speckle noise.

As a method of reducing the above-described speckle noise, a method of vibrating the illuminated surface and a method of placing a diffusing plate in the optical path between the semiconductor laser and the illuminated surface may be mentioned. Each of these methods, however, requires a markedly high cost of implementation. There is a relationship $Cs \propto 1/\sqrt{\Delta\lambda}$ between the magnitude $Cs$ of speckle noise and the half-width $\Delta\lambda$ of the oscillation spectrum of laser beam. Increasing the half-width of the oscillation wavelength of the light source is effective as a method for reducing speckle noise.

A plurality of semiconductor lasers differing in wavelength may be used to increase the half-width of the oscillation wavelength of the light source. However, there is a need to manufacture a plurality of semiconductor lasers having active layers different from each other. Also, a plurality of laser beams differing in wavelength cannot be emitted from one semiconductor laser.

SUMMARY

In view of the above-described problem, an object of the present invention is to provide a semiconductor laser device in which the half-width of the oscillation wavelength of one semiconductor laser can be increased to reduce speckle noise.

According to the present invention, a semiconductor laser device includes: a semiconductor laser including a plurality of emission regions into which currents are injected to emit laser beams and first and second major surfaces opposite to each other; and a plurality of first wires bonded to the first major surface of the semiconductor laser, wherein the first major surface of the semiconductor laser has a first stripe region corresponding to one of the plurality of emission regions, and a second stripe region corresponding to another of the plurality of emission regions, and the number of the first wires bonded to the first stripe region is larger than the number of the first wires bonded to the second stripe region.

In the semiconductor laser device according to the present invention, wire bonding positions are set one-sidedly on one emission region to make uneven currents flowing into the emission regions, and heat generated in the wires is caused to flow one-sidedly into the one emission region, thereby obtaining different active layer temperatures. The oscillation wavelengths of laser beams emitted from the emission regions are thereby made different from each other, thus increasing the half-width of one semiconductor laser and reducing speckle noise.

Other and further objects, features and advantages of the invention will appear more fully from the following description.

DESCRIPTION OF EMBODIMENTS

A semiconductor laser device according to the embodiments of the present invention will be described with reference to the drawings. The same components will be denoted by the same symbols, and the repeated description thereof may be omitted.

First Embodiment

Figure 1:
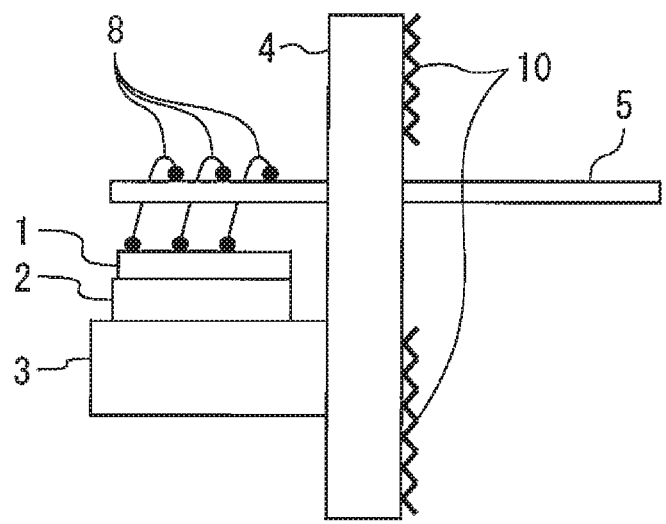
FIG. 1 is a side view of a semiconductor laser device according to a first embodiment of the present invention.
Figure 2:
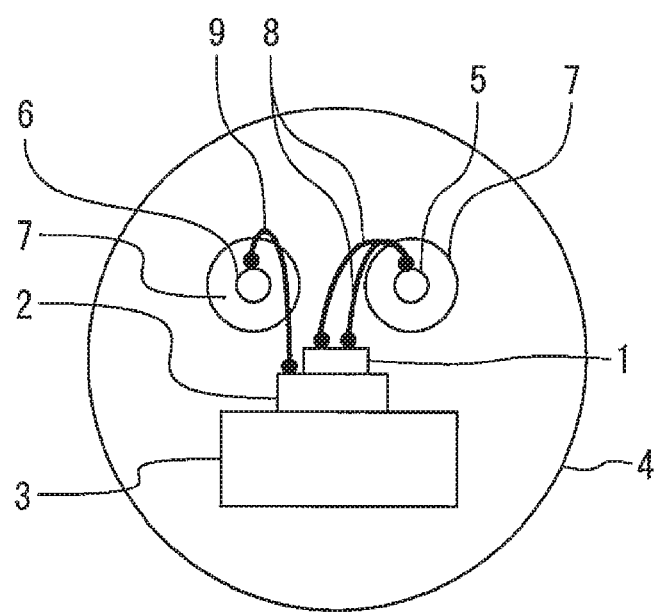
FIG. 2 is a front view of the semiconductor laser device according to the first embodiment of the present invention.

FIG. 1 is a side view of a semiconductor laser device according to a first embodiment of the present invention. FIG. 2 is a front view of the semiconductor laser device according to the first embodiment of the present invention. A semiconductor laser 1 is incorporated in a φ9.0 mm-stem package frequently used in light sources for communication, disk systems or projectors.

The semiconductor laser 1 is joined to a submount 2. The submount 2 is mounted on a block 3 on a stem. Copper is ordinarily used as a material for the block 3 in order to reduce the thermal resistance of the package. The block 3 is bonded to an eyelet 4 on the stem. The diameter of the eyelet 4 is 9.0 mm.

Leads 5 and 6 are passed through holes provided in the eyelet 4. Sealing glass 7 for electrically separating the eyelet 4 and the leads 5 and 6 from each other is provided between the eyelet 4 and the leads 5 and 6. An upper surface of the semiconductor laser 1 and the lead 5 are electrically connected to each other by gold wires 8. An upper surface of the submount 2 and the lead 6 are electrically connected to each other by gold wires 9.

A bottom surface 10 of the eyelet 4 is in contact with a frame (not shown) for the system. As a result, heat generated from the semiconductor laser 1 is released to the outside through the submount 2, the block 3, the eyelet 4 and the bottom surface of the eyelet 4. The stem package may be capped in order to encapsulate the semiconductor laser 1.

Figure 3:
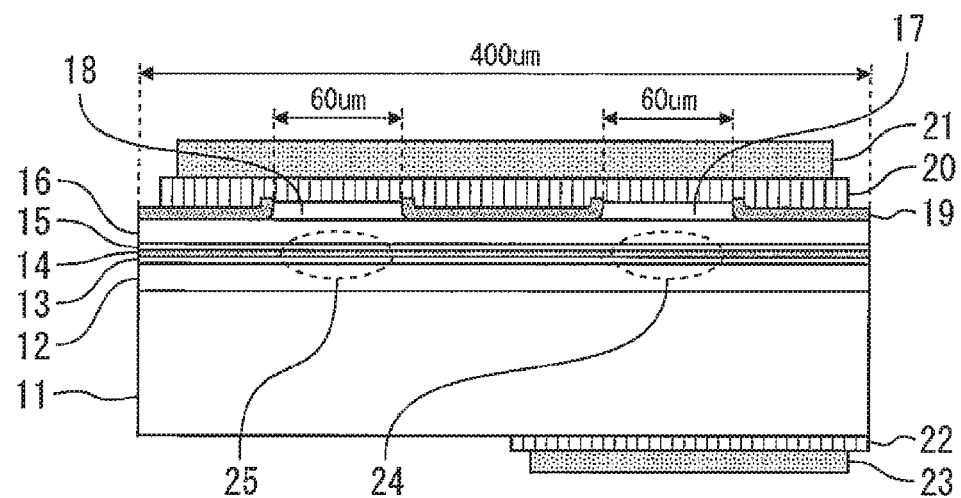
FIG. 3 is a sectional view of the semiconductor according to the first embodiment of the present invention.

FIG. 3 is a sectional view of the semiconductor laser 1 according to the first embodiment of the present invention. An n-type AlInP lower cladding layer 12, an undoped AlInP lower optical guide layer 13, a GaInP active layer 14, an undoped AlGaInP upper optical guide layer 15, a p-type AlInP upper cladding layer 16 and p-type GaAs contact layers 17 and 18 are successively formed on an n-type GaAs semiconductor substrate 11. The contact layers 17 and 18 are etched to form ridge stripes.

The semiconductor substrate 11 has a thickness of 50 to 150 μm. The lower cladding layer 12 has a thickness of 0.5 to 4.0 μm and a carrier concentration of 0.5 to $1.5 \times 10^{18}$ cm$^{-3}$. Each of the lower optical guide layer 13 and the upper optical guide layer 15 has a thickness of 0.02 to 0.4 μm. The active layer 14 has a thickness of 3.0 to 20 nm. The upper cladding layer 16 has a thickness of 0.5 to 4.0 μm and a carrier concentration of 0.5 to $2.0 \times 10^{18}$ cm$^{-3}$. Each of the contact layers 17 and 18 has a thickness of 0.05 to 0.5 μm and a carrier concentration of 1.0 to $4.0 \times 10^{19}$ cm$^{-3}$.

Insulating film 19 such as silicon nitride film is formed on the upper cladding layer 16 and at opposite sides of the contact layers 17 and 18. Openings are formed in the insulating film 19 on the contact layers 17 and 18. Each opening has a width of 60 μm.

A p-side electrode 20 is formed on the contact layers 17 and 18 and the insulating film 19 and is low-resistance-joined to the contact layers 17 and 18 through the openings of the insulating film 19. An gold plating layer 21 is formed on the p-side electrode 20. The p-side electrode 20 is a multilayer structure formed of thin films of, for example, Ti, Pr or Au and has a total thickness of 0.05 to 1.0 μm. The gold plating layer 21 has a thickness of 1.0 to 6.0 μm. An n-side electrode 22 is joined to a lower surface of the semiconductor substrate 11. An gold plating layer 23 is formed on a lower surface of the n-side electrode 22. The n-side electrode 22 is a multilayered structure formed of thin films of, for example, Ti, Pr or Au and has a total thickness of 0.05 to 1.0 μm. The gold plating layer 23 has a thickness of 1.0 to 6.0 μm.

Regions in the active layer 14 located right below the two openings of the insulating film 19 are formed as first and second emission regions 24 and 25 into which currents are injected to emit laser beam. Thus, laser beams are emitted from two places in the semiconductor laser 1. The n-side electrode 22 and the gold plating layer 23 are formed on only the first emission region 24 side of the semiconductor substrate 11.

Figure 4:
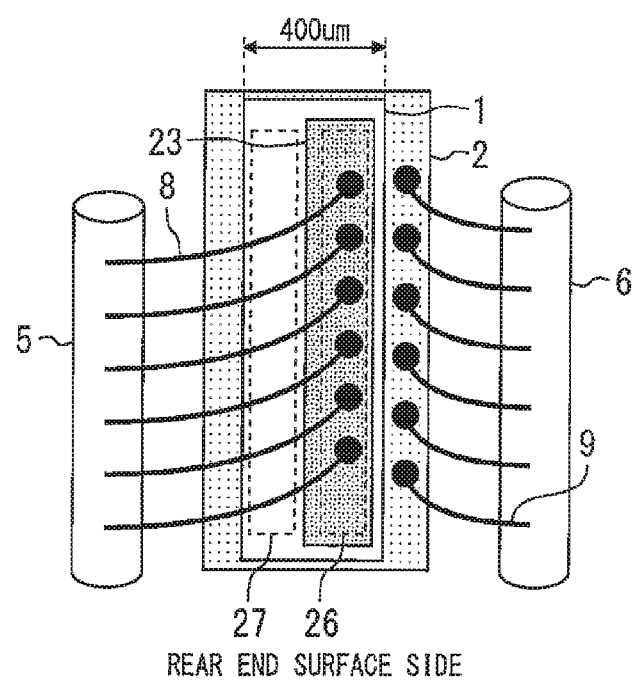
FIG. 4 is a plan view of essential portions of the semiconductor laser device according to the first embodiment of the present invention.

FIG. 4 is a plan view of essential portions of the semiconductor laser device according to the first embodiment of the present invention. The semiconductor laser 1 shown in FIG. 3 is shown upside down. The gold plating layer 21 on the front surface of the semiconductor laser 1 is joined to the submount 2. The active layer 14 of the semiconductor laser 1 is therefore markedly close to the submount 2. A plurality of gold wires 8 are bonded to the gold plating layer 23 on the back surface of the semiconductor laser 1. A plurality of gold wires 9 are bonded to the submount 2. Each of the number of gold wires 8 and the number of gold wires 9 is 6, and each gold wire has a diameter of 25 μm and a length of 2.0 mm.

The back surface of the semiconductor laser 1 has a first stripe region 26 corresponding to the first emission region 24, and a second stripe region 27 corresponding to the second emission region 25. The n-side electrode 22 and the gold plating layer 23 are formed on the first stripe region 26, not on the second stripe region 27. The plurality of gold wires 8 are bonded only to the first stripe region 26.

A method of manufacturing the semiconductor laser 1 according to the present embodiment will subsequently be described. First, the lower cladding layer 12, the lower optical guide layer 13, the active layer 14, the upper optical guide layer 15, the upper cladding layer 16 and a contact layer are successively formed on the semiconductor substrate by a crystal growth method such as metal organic chemical vapor deposition (MOCVD). The contact layer is then selectively removed by etching to leave the contact layers 17 and 18 only on the first and second emission regions 24 and 25. The insulating film 19 is thereafter formed on the entire surface, and portions of the insulating film 19 on the first and second emission regions 24 and 25 are removed by etching. Subsequently, the p-side electrode 20 and the gold plating layer 21 are formed. Subsequently, the back surface of the semiconductor substrate 11 is polished so that the semiconductor substrate 11 has a desired thickness, and the n-side electrode 22 and the gold plating layer 23 are formed. The semiconductor substrate 11 is cleaved so that the resonator length is 1.5 mm, a coating having a reflectance of 10% is formed on the front end surface, and a coating having a reflectance of 90% is formed on the rear end surface. The semiconductor laser 1 according to the present embodiment is manufactured according to the above-described method.

Figure 5:
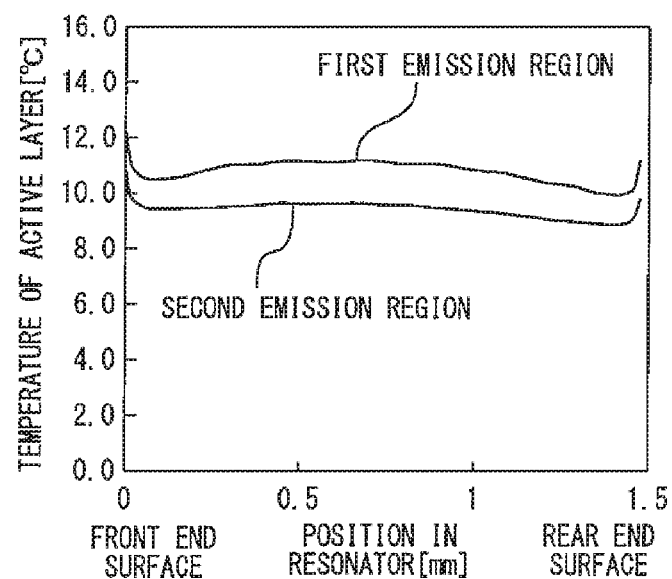
FIG. 5 is a diagram showing the results of obtaining temperature distributions in the active layer in the resonator of the semiconductor laser according to the first embodiment of the present invention.

Currents flow through the first and second emission regions 24 and 25, and laser beam is guided through the first and second emission regions 24 and 25. In the first and second emission regions 24 and 25, therefore, heat is generated due to threshold currents, non-emission recoupling, light absorption or Joule beat. FIG. 5 is a diagram showing the results of obtaining temperature distributions in the active layer in the resonator of the semiconductor laser according to the first embodiment of the present invention. Heat simulation was made by assuming that the total value of currents injected into the semiconductor laser 1 is 5.0 A and the outside temperature is 0° C. and by considering Joule heat with respect to the first and second emission regions 24 and 25. In FIG. 5, 0 on the abscissa corresponds to the position of the front end surface and 1.5 mm on the abscissa corresponds to the position of the rear end surface. Here, heat generation due to light absorption and non-emission recoupling is excepted. However, temperature distributions in the two emission regions due to light absorption and non-emission recoupling are equal to each other because the front and rear end surface reflectances, the optical gains and the threshold current values of the two emission regions are substantially equal to each other.

There is a difference of about 1.5° C. between the active layer temperature in the first emission region 24 and the active layer temperature in the second emission region 25. The cause of this is as described below. As shown in FIG. 4, the gold wires 8 are connected one-sidedly on the first emission region 24, and the electrode exists only on the first emission region 24 side. The current flowing from the gold wires 8 into the first emission region 24 is therefore larger than the current flowing from the gold wires 8 into the second emission region 25. As a result, Joule heat in the first emission region 24 is larger than that in the second emission region 25. Further, since the gold wires 8 are connected on the first emission region 24 side, Joule heat generated in the gold wires S is transferred to the vicinity of the first emission region 24 to further increase the temperature difference between the first emission region 24 and the second emission region 25.

The temperature dependence of the oscillation wavelength, which varies depending on the materials of the semiconductor laser and the oscillation wavelength, is about 0.20 nm/° C. in the semiconductor laser 1 according to the present embodiment using an AlGaInP-based material. In the semiconductor laser 1, therefore, the wavelength difference between the first emission region 24 and the second emission region 25 is about 0.3 nm. Thus, laser beams differing in wavelength are emitted from one semiconductor laser 1.

Figure 6:
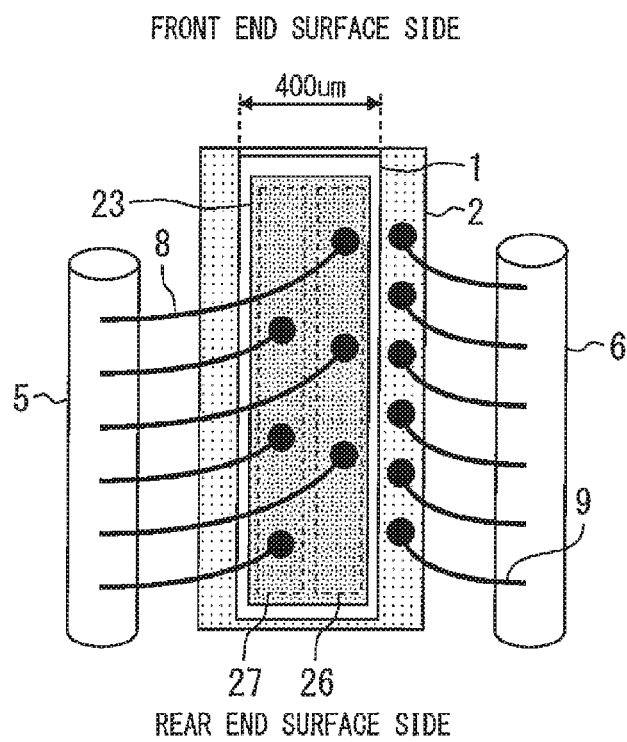
FIG. 6 is a plan view showing essential portions of a semiconductor laser device according to a comparative example.
Figure 7:
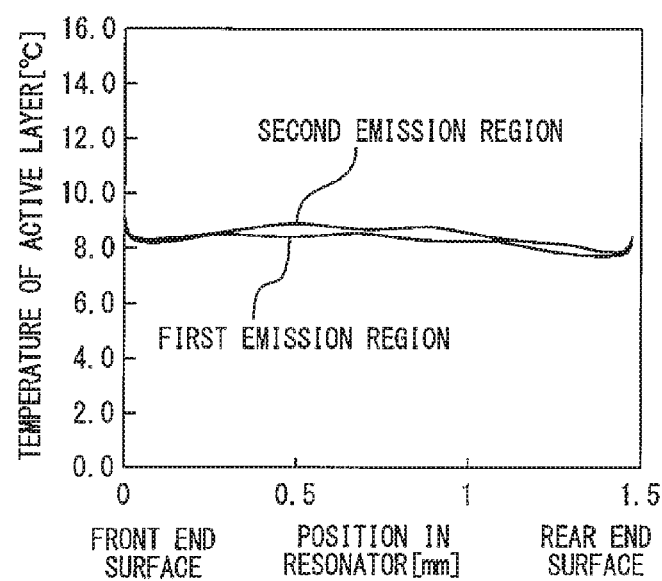
FIG. 7 is a diagram showing the results of obtaining temperature distributions in the active layer in the resonator of the semiconductor laser according to the comparative example.

FIG. 6 is a plan view showing essential portions of a semiconductor laser device according to a comparative example. For uniform current injection into a plurality of emission regions, the first and second stripe regions 26 and 27 respectively corresponding to the first and second emission regions 24 and 25 are evenly bonded. FIG. 7 is a diagram showing the results of obtaining temperature distributions in the active layer in the resonator of the semiconductor laser according to the comparative example. Heat simulation was made under the same conditions as in FIG. 5. The temperature difference between the first emission region 24 and the second emission region 25 is small. Accordingly, the wavelengths of beams emitted from the two emission regions are substantially equal to each other. The half-width of the emission wavelength of one semiconductor laser 1 is therefore narrow, so that speckle noise occurs.

On the other hand, in the semiconductor laser device according to the present embodiment, wire bonding positions are set one-sidedly on one emission region to make uneven currents flowing into the emission regions, and heat generated in the wires is caused to flow one-sidedly into the one emission region, thereby obtaining different active layer temperatures. The oscillation wavelengths of laser beams emitted from the emission regions are thereby made different from each other, thus increasing the half-width of one semiconductor laser 1 and reducing speckle noise.

Figure 8:
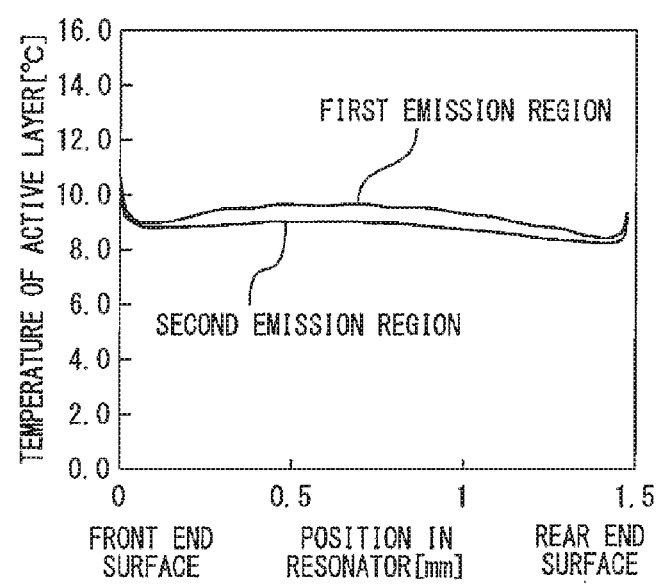
FIG. 8 is a diagram showing the results of obtaining temperature distributions in the active layer in the resonator in a case where the n-side electrode and the gold plating layer are formed on the entire surface.

FIG. 8 is a diagram showing the results of obtaining temperature distributions in the active layer in the resonator in a case where the n-side electrode and the gold plating layer are formed on the entire surface. It can be understood that the temperature difference between the first emission region 24 and the second emission region 25 is reduced in comparison with the case of the present embodiment shown in FIG. 5. Moderation of current one-sidedness by current spread on the electrode can thus be prevented by forming the n-side electrode 22 and the gold plating layer 23 only on one of the emission regions as shown in FIG. 4.

The wire-bonded first stripe region 26 of the semiconductor laser 1 is closer to the wire-bonded region of the submount 2 than the second stripe region 27 not wire-bonded. The distance between the two wire-bonded regions is reduced as described above, thereby increasing the current flowing through the wire-bonded first emission region 24 while reducing the current flowing through the second emission region 25 not wire-bonded. As a result, the temperature difference between the first emission region 24 and the second emission region 25 is increased and the advantage of the present invention is heightened.

Second Embodiment

Figure 9:
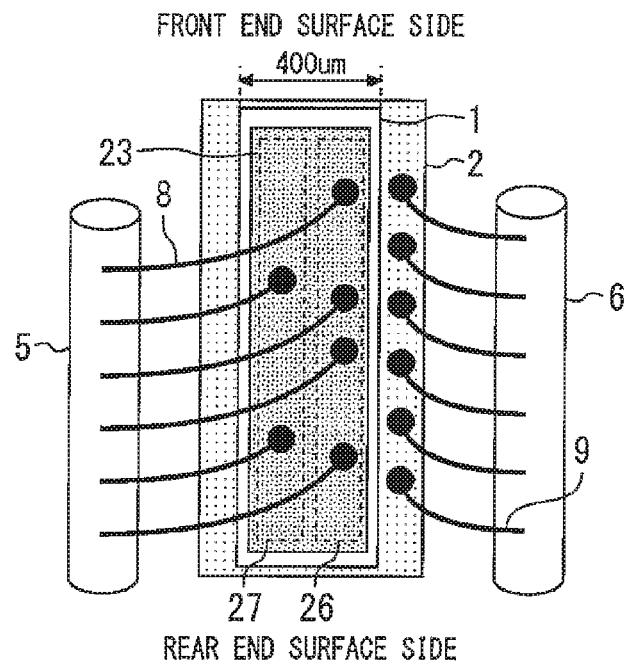
FIG. 9 is a plan view of essential portions of a semiconductor laser device according to a second embodiment of the present invention.

FIG. 9 is a plan view of essential portions of a semiconductor laser device according to a second embodiment of the present invention. The number of the plurality of gold wires 8 bonded to the first stripe region 26 is larger than the number of gold wires 8 bonded to the second stripe region 27. Thus, it is not necessarily required that all the gold wires 8 be bonded to only one of the emission regions. As long as the numbers of wires are uneven, a temperature difference occurs between the first emission region 24 and the second emission region 25, enabling reduction of speckle noise.

Third Embodiment

Figure 10:
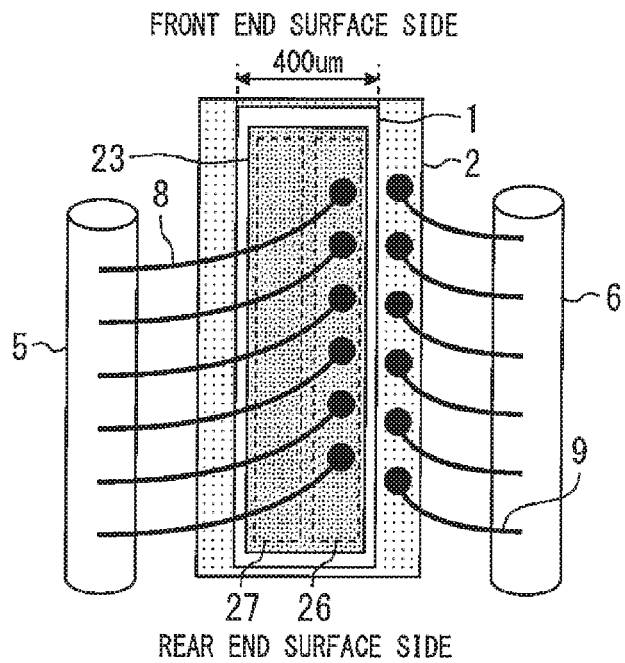
FIG. 10 is a plan view of essential portions of a semiconductor laser device according to a third embodiment of the present invention.

FIG. 10 is a plan view of essential portions of a semiconductor laser device according to a third embodiment of the present invention. A plurality of gold wires 8 are bonded only to the first stripe region 26. The temperature difference between the first emission region 24 and the second emission region 25 is thereby made larger than that in the second embodiment, thus achieving a further reduction of speckle noise. However, the larger temperature difference can be achieved in the case where the n-side electrode 22 and the gold plating layer 23 are formed only on the first stripe region 26 as in the first embodiment.

The first to third embodiments have been described with respect to a case where the number of emission regions of the semiconductor laser 1 is two. The present invention, however, is not limited to this. It is apparent that the same advantage can also be achieved in a case where the semiconductor laser 1 has three or more emission regions. In the case where the number of emission regions is two, however, the spacing between the emission regions is so large that the current flowing mainly into one of the emission regions cannot easily flow into the other adjacent emission region. As a result, the difference between the currents flowing into the two emission regions is increased and the advantage of the present invention is thereby heightened.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-045757, filed on Mar. 9, 2016 including specification, claims, drawings and summary, on which the Convention priority of the present application is based, is incorporated herein by reference in its entirety.

The invention claimed is:

1. A semiconductor laser device comprising:
   a semiconductor laser including a plurality of emission regions into which currents are injected to emit laser beams and first and second major surfaces opposite to each other; and
   a plurality of first wires bonded to the first major surface of the semiconductor laser,
   wherein the first major surface of the semiconductor laser has a first stripe region corresponding to one of the plurality of emission regions, and a second stripe region corresponding to another of the plurality of emission regions, and the number of the first wires bonded over the first stripe region is larger than the number of the first wires bonded over the second stripe region.

2. The semiconductor laser device according to claim 1, wherein the plurality of first wires are bonded only over the first stripe region.

3. The semiconductor laser device according to claim 2, wherein the semiconductor laser includes an electrode to which the plurality of first wires are bonded, and
the electrode is formed on the first stripe region, not on the second stripe region.

4. The semiconductor laser device according to claim 1, further comprising:
a submount to which the second major surface of the semiconductor laser is joined; and
a second wire bonded to the submount,
wherein the first stripe region of the semiconductor laser is closer to a wire-bonded region of the submount than the second stripe region.

5. The semiconductor laser device according to claim 1, wherein the number of the plurality of emission regions is two.

* * * * *